US012754211B2

(12) United States Patent
Javora et al.

(10) Patent No.: US 12,754,211 B2
(45) Date of Patent: Oct. 6, 2026

(54) MEDIUM OR HIGH VOLTAGE INSTRUMENT VOLTAGE TRANSFORMER

(71) Applicant: ABB Schweiz AG, Baden (CH)

(72) Inventors: Radek Javora, Hrusovany u Brna (CZ); Marek Pavlas, Otnice (CZ)

(73) Assignee: ABB Schweiz AG, Baden (CH)

( * ) Notice: Subject to any disclaimer, the term of this patent is extended or adjusted under 35 U.S.C. 154(b) by 146 days.

(21) Appl. No.: 18/670,854

(22) Filed: May 22, 2024

(65) Prior Publication Data

US 2024/0393370 A1 Nov. 28, 2024

(30) Foreign Application Priority Data

May 23, 2023 (EP) .................................... 23174869

(51) Int. Cl.
*G01R 15/04* (2006.01)
*G01R 19/00* (2006.01)

(52) U.S. Cl.
CPC ......... *G01R 15/04* (2013.01); *G01R 19/0084* (2013.01)

(58) Field of Classification Search
CPC ............................ G01R 15/04; G01R 19/0084
See application file for complete search history.

(56) References Cited

U.S. PATENT DOCUMENTS

| | | | | |
|---|---|---|---|---|
| 9,696,345 | B2 * | 7/2017 | Javora | G01R 1/18 |
| 10,355,470 | B2 * | 7/2019 | Czyzewski | H02G 15/064 |
| 10,460,893 | B2 * | 10/2019 | Shang | H01H 33/027 |
| 2019/0257856 | A1 | 8/2019 | Javora | |
| 2020/0363456 | A1 | 11/2020 | Stollwerck et al. | |

FOREIGN PATENT DOCUMENTS

| | | | |
|---|---|---|---|
| EP | 3223024 | A1 | 9/2017 |
| EP | 3671227 | A1 | 6/2020 |

OTHER PUBLICATIONS

European Patent Office, Extended European Search Report in European Patent Application No. 23174869.0, 9 pp. (Nov. 7, 2023).

* cited by examiner

*Primary Examiner* — Reena Aurora
(74) *Attorney, Agent, or Firm* — Fitch Even Tabin & Flannery LLP

(57) ABSTRACT

A medium or high voltage sensor includes a medium or high voltage sensing unit; a primary connection; a cable connection; and at least one fixation part; wherein the primary connection is connected to a first terminal of the medium or high voltage sensor unit; wherein the cable connection is connected to a second terminal of the medium or high voltage sensor unit; wherein the at least one fixation part is located at a base end of the medium or high voltage sensor unit; and wherein the at least one fixation part is configured to connect to an external structure.

16 Claims, 3 Drawing Sheets

MEDIUM OR HIGH VOLTAGE INSTRUMENT VOLTAGE TRANSFORMER

CROSS-REFERENCE TO RELATED APPLICATIONS

The instant application claims priority to European Patent Application No. 23174869.0, filed May 23, 2023, which is incorporated herein in its entirety by reference.

FIELD OF THE DISCLOSURE

The present disclosure generally relates to a medium or high voltage instrument voltage transformer, to a kit of parts to form a medium or high voltage sensor, and to a method of manufacturing a medium or high voltage sensor.

BACKGROUND OF THE INVENTION

Medium or high voltage sensor designs, can be based on a capacitive, resistive, or capacitive/resistive combination (hereafter called impedance) voltage divider, where for example a voltage drop occurs across several impedance elements in series between a medium or high voltage and ground or earth potential, and where sensing across the last impedance element and ground potential enables the medium or high voltage itself to be sensed.

Presently outdoor medium or high voltage sensor designs are usually bulky, and are cast in outdoor-graded thermoset material, and are made in relatively low volumes. It can also be difficult to mount or fix both indoor and outdoor medium or high voltage sensors at the required locations. This contributes to high costs.

BRIEF SUMMARY OF THE INVENTION

It would be advantageous to have an improved medium or high voltage sensor that is suitable to be mounted in different location, including that for outdoor use. In an aspect, there is provided a medium or high voltage sensor, comprising: a medium or high voltage sensing unit; a primary connection; a cable connection; and at least one fixation part. The primary connection is connected to a first terminal of the medium or high voltage sensor unit. The cable connection is connected to a second terminal of the medium or high voltage sensor unit. The at least one fixation part is located at a base end of the medium or high voltage sensor unit. The at least one fixation part is configured to connect to an external structure.

BRIEF DESCRIPTION OF THE SEVERAL VIEWS OF THE DRAWING(S)

DETAILED DESCRIPTION OF THE INVENTION

Figure 1:
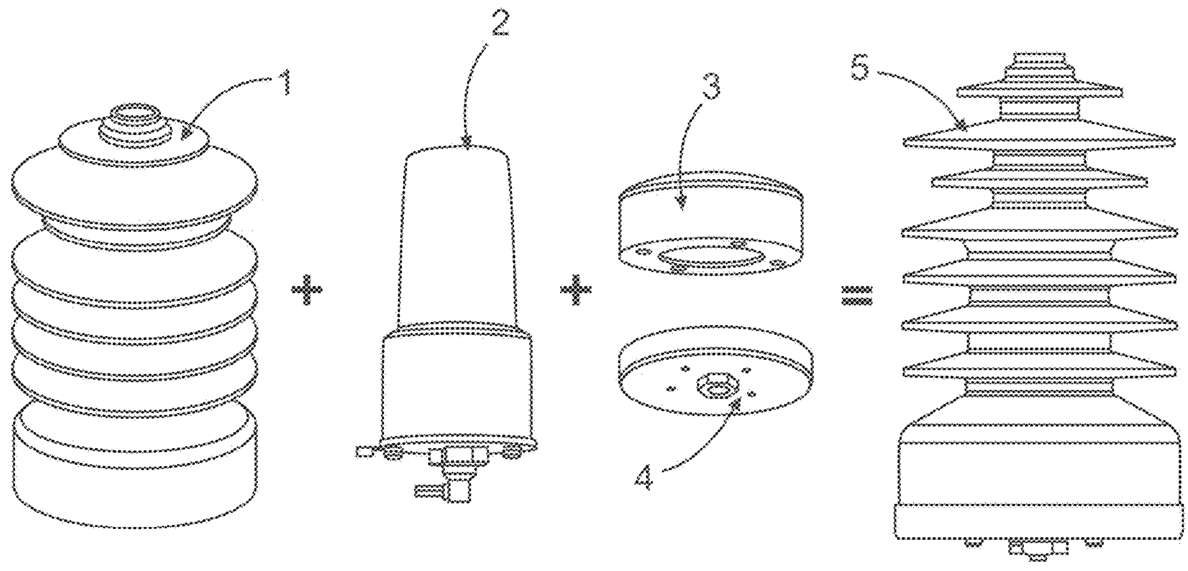
FIG. 1 shows a schematic representation of the different parts of an exemplar medium or high voltage sensor in accordance with the disclosure.

FIGS. 1-5, relate to a medium or high voltage sensor, a kit of parts to form a medium or high voltage sensor, and a method of manufacturing a medium or high voltage sensor.

In an example, a medium or high voltage sensor 5 comprises: a medium or high voltage sensing unit 2; a primary connection 10; a cable connection 6; and at least one fixation part 3, 4. The primary connection is connected to a first terminal of the medium or high voltage sensor unit. The cable connection is connected to a second terminal of the medium or high voltage sensor unit. The at least one fixation part is located at a base end of the medium or high voltage sensor unit. The at least one fixation part is configured to connect to an external structure.

Thus, a number of different fixation parts can be made that can be used to fix to different external structures, but have a common part of the structure that can fit to the same medium or high voltage sensor unit. Thus, the same medium or high voltage sensor unit can be used in different situations and be able to be fixed to different external structures by choosing the appropriate at least one fixation part to fix to the external structure.

According to an example, the at least one fixation part comprises a first fixation part 3 and a second fixation part 4. An inner surface of the first fixation part is located adjacent to an outer surface of the medium or high voltage sensor unit. The outer surface of the medium or high voltage sensor unit is cylindrically shaped or conically shaped. The second fixation part is connected to the first fixation part.

In an example, the inner surface of the first fixation part is in contact with the outer surface of the medium or high voltage sensor unit. In an example, the inner surface of the first fixation part is connected to the outer surface of the medium or high voltage sensor unit. In an example, the inner surface of the first fixation part is glued to the outer surface of the medium or high voltage sensor unit.

According to an example, an inner surface of the first fixation part is cylindrically shaped or conically shaped. In an example, the inner surface of the first fixation part has the same shape as the outer surface of the medium or high voltage sensor unit.

According to an example, the second fixation part is connected to an end portion of the first fixation part. According to an example, the end portion of the first fixation part is annular shaped.

According to an example, the medium or high voltage sensor unit comprises an impedance voltage divider. According to an example, the first terminal of the medium or high voltage sensor unit is a terminal at an end position of a plurality of capacitive and/or resistive elements of the impedance voltage divider. According to an example, the second terminal of the medium or high voltage sensor unit is a terminal at a position between capacitive and/or resistive elements of the impedance voltage divider.

According to an example, the at least one fixation part is connected to a third terminal of the medium or high voltage sensor unit. According to an example, the third terminal is a terminal at an end position of a plurality of capacitive and/or resistive elements of the impedance voltage divider.

According to an example, the sensor comprises an earthing wire 7. The earthing wire is connected to the at least one fixation part to provide an earth connection for the medium or high voltage sensor unit. According to an example, the sensor comprises an earthing wire 7. The earthing wire is connected to the earth terminal located within one fixation part to provide an earth connection for the medium or high voltage sensor unit.

According to an example, the sensor comprises a silicone rubber sleeve 1. The silicone rubber sleeve is located around an outer surface of the medium or high voltage sensor unit. In an example, the silicone rubber sleeve is in contact with the outer surface of the medium or high voltage sensor unit. According to an example, the silicone rubber sleeve is located around an outer surface of the primary connection. In an example, the silicone rubber sleeve is in contact with the outer surface of the primary connection. In an example, the silicone rubber sleeve is located around an outer surface of the at least one fixation part. In an example, the silicone rubber sleeve is in contact with the outer surface of the at least one fixation part. In an example, the silicone rubber sleeve is designed for outdoor applications.

Thus, a medium or high voltage sensor unit that cannot itself be utilized in outdoor situations has now in effect been made weatherproof.

As is clear from the figures, a kit of parts is also provided to form a medium or high voltage sensor 5. The kit of parts comprises: a medium or high voltage sensing unit 2; a primary connection 10; a cable connection 6; and at least one fixation part 3, 4. The primary connection is configured to connect to a first terminal of the medium or high voltage sensor unit. The cable connection is configured to connect to a second terminal of the medium or high voltage sensor unit. The at least one fixation part is configured to be located at a base end of the medium or high voltage sensor unit. The at least one fixation part is configured to connect to an external structure.

In an example, the at least one fixation part comprises a first fixation part 3 and a second fixation part 4. An inner surface of the first fixation part is configured to be located adjacent to an outer surface of the medium or high voltage sensing unit. The outer surface of the medium or high voltage sensing unit is cylindrically shaped or conically shaped. The second fixation part is configured to be connected to the first fixation part.

In an example, the inner surface of the first fixation part is configured to be in contact with the outer surface of the medium or high voltage sensing unit. In an example, the inner surface of the first fixation part is configured to be connected to the outer surface of the medium or high voltage sensor unit. In an example, the inner surface of the first fixation part is configured to be glued to the outer surface of the medium or high voltage sensor unit.

In an example, the first fixation part is made of thermoset or thermoplasting material, in liquid state filled, into the silicone sleeve with medium or high voltage sensing unit pre-assembled, thus tightly adhering to the outer surface of the medium or high voltage sensing unit. Once the thermoset of thermoplastic material solidifies, it will ensure mechanical properties required.

In an example, the first fixation part is common to the medium or high voltage sensor unit, and the second fixation part is selected from a number of different second fixation parts dependent upon the external structure to which the fixation is to be made. Thus, in an example the kit comprises a plurality of second fixation parts that are different to each other but which all are configured to connect to the same first fixation part, and where every different second fixation part can connect to different external structures with respect to the required fixation to be used.

In an example, the first fixation part is made of non-conductive material. In an example, the second fixation part is made of electrically conductive material. The second fixation part is electrically connected to the third terminal of the medium or high voltage sensor. In an example, the second fixation part is made of electrically non-conductive material. In that case it needs to provide a possibility to access, directly or through an additional terminal, the third terminal of the medium or high voltage sensor.

In an example, an inner surface of the first fixation part is cylindrically shaped or conically shaped. In an example, the inner surface of the first fixation part has the same shape as the outer surface of the medium or high voltage sensing unit. In an example, the second fixation part is configured to connect to an end portion of the first fixation part. In an example, the end portion of the first fixation part is annular shaped.

In an example, the medium or high voltage sensing unit comprises a capacitive and/or resistive voltage divider. In an example, the first terminal of the medium or high voltage sensing unit is a terminal at an end position of a plurality of capacitive and/or resistive elements of the impedance voltage divider. In an example, the second terminal of the medium or high voltage sensor unit is a terminal at a position between capacitive and/or resistive elements of the impedance voltage divider.

In an example, the at least a portion of one fixation part is configured to be connected to a third terminal of the medium or high voltage sensing unit. In an example, the third terminal is a terminal at an end position of a plurality of capacitive and/or resistive elements of the impedance voltage divider.

In an example, the kit comprises an earthing wire 7. The earthing wire is configured to be connected to the at least a portion of one fixation part to provide an earth connection for the medium or high voltage sensor unit.

In an example, the kit comprises a silicone rubber sleeve 1. The silicone rubber sleeve is configured to be located around an outer surface of the medium or high voltage sensor unit. In an example, the silicone rubber sleeve is configured to be in contact with the outer surface of the medium or high voltage sensor unit. In an example, the silicone rubber sleeve is configured to be located at least partly around an outer surface of the primary connection. In an example, the silicone rubber sleeve is configured to be in contact with the outer surface of the primary connection. In an example, the silicone rubber sleeve is configured to be located around an outer surface of the at least one fixation part. In an example, the silicone rubber sleeve is configured to be in contact with the outer surface of the at least one fixation part. In an example, the silicone rubber sleeve is designed for outdoor applications.

A method of manufacturing a medium or high voltage sensor 5, comprises: connecting a primary connection 10 to a first terminal of a medium or high voltage sensor unit 2; connecting a cable connection 6 to a second terminal of the medium or high voltage sensor unit; locating at least one fixation part 3,4 at a base end of the medium or high voltage sensor unit; and the at least one fixation part is configured to connect to an external structure.

In an example, the at least one fixation part comprises a first fixation part 3 and a second fixation part 4, and the method comprises: locating an inner surface of the first fixation part adjacent to an outer surface of the medium or high voltage sensing unit, wherein the outer surface of the medium or high voltage sensing unit is cylindrically shaped or conically shaped; and connecting the second fixation part to the first fixation part.

In an example, the method comprises passing the first fixation part over a top end of the medium or high voltage sensing unit. In an example, the method comprises contacting the inner surface of the first fixation part with the outer surface of the medium or high voltage sensing unit. In an example, method comprises connecting the inner surface of the first fixation part to the outer surface of the medium or high voltage sensing unit. In an example, the method comprises gluing the inner surface of the first fixation part to the outer surface of the medium or high voltage sensing unit.

In an example, the method comprises greasing of the inner surface of the first fixation part to the outer surface of the medium or high voltage sensing unit. Thus using a lubricant facilitates assembly.

Thus, as shown in the figures the medium or high voltage sensing unit 2 can have a conical shaped lower outer end section and a first fixation part 3 can have a similarly shaped inner surface. The first fixation part 3 is then put over the end of the medium or high voltage sensing unit 2 and slid downwards until both surfaces, at least partly, mate together. The components could be glued, but need not be. The second fixation part 4 is then selected dependent upon how the sensor is to be fixed, i.e. where bolt holes are located etc. for external fixation. The first fixation part 3 has bolt holes, and each of the second fixation parts have common holes that enable the second fixation part 4 to be bolted at the underside of the medium or high voltage sensing unit 2 to the first fixation part. The whole fixation formed by first fixation part 3 and the second fixation part 4 is then secured attached to the medium or high voltage sensing unit 2 without there having be any attached between the fixation parts and the medium or high voltage sensing unit 2 as such. This facilitates replacement etc., and by having the fixation part 3, 4 in two sections, one common section can be used along with different second sections to attach in different situation.

The medium or high voltage sensing unit 2 could have a cylindrical shaped lower or base section, and then the first fixation part 3 has a cylindrical inner shape that closely fits the outer cylindrical shape of the medium or high voltage sensing unit 2. In this situation, the first fixation part can then be glued to the medium or high voltage sensing unit 2, and then the second fixation part chose as required, and connected to the first fixation part.

In an example, an inner surface of the first fixation part is cylindrically shaped or conically shaped. In an example, the inner surface of the first fixation part has the same or similar shape as the outer surface of the medium or high voltage sensing unit. In an example, the method comprises connecting the second fixation part to an end portion of the first fixation part. In an example, the end portion of the first fixation part is annular shaped.

In an example, the method comprises passing the first fixation part over the top end of the medium or high voltage sensing unit such that the end port of the first fixation part is directed towards the base end of the medium or high voltage sensing unit and then the second fixation part is moved towards the first fixation part from the opposite direction and connected to the first fixation part to cover a bottom surface of the medium or high voltage sensor unit. In an example, the medium or high voltage sensing unit comprises a capacitive, resistive or capacitive/resistive combination voltage divider.

In an example, the first terminal of the medium or high voltage sensing unit is a terminal at an end position of a plurality of capacitive and/or resistive elements of the impedance voltage divider. In an example, the second terminal of the medium or high voltage sensing unit is a terminal at a position between capacitive and/or resistive elements of the impedance voltage divider. In an example, the method comprises connecting the at least one fixation part to a third terminal of the medium or high voltage sensing unit. In an example, the third terminal is a terminal at an end position of a plurality of capacitive and/or resistive elements of the impedance voltage divider. In an example, the method comprises connecting an earthing wire 7 to the at least a portion of one fixation part to provide an earth connection for the medium or high voltage sensing unit.

In an example, the method comprises locating a silicone rubber sleeve 1 around an outer surface of the medium or high voltage sensing unit. In an example, the silicone rubber sleeve is in contact with the outer surface of the medium or high voltage sensing unit. In an example, the method comprises locating the silicone rubber sleeve around at least part of an outer surface of the primary connection. In an example, the silicone rubber sleeve is in at least partial contact with the outer surface of the primary connection. In an example, the method comprises locating the silicone rubber sleeve around an outer surface of the at least one fixation part. In an example, the silicone rubber sleeve is in contact with the outer surface of the at least one fixation part. In an example, the silicone rubber sleeve is designed for outdoor applications.

A method of manufacturing a medium or high voltage sensor 5, comprises: connecting a primary connection 10 to a first terminal of a medium or high voltage sensor unit 2; connecting a cable connection 6 to a second terminal of the medium or high voltage sensor unit; filling the remaining bottom part of silicone rubber sleeve 1 with thermoplastic or thermoset material, thus forming at least portion of one fixation part 3,4 at a base end of the medium or high voltage sensor unit; and the at least one fixation part is configured to connect to an external structure.

Other steps of manufacturing the medium or high voltage sensor 5 are as discussed above. Several detailed specific embodiments are now described, where reference is again made to FIGS. 1-5.

The new development described here can in effect be considered to relate to a voltage sensor with an additional base part that enables mechanical fixation to external structures. The new development also relates to a simple and light construction of an outdoor-grade medium- or high-voltage voltage sensor. In the new development the voltage sensor, that can be for example an existing voltage sensor designed for indoor application, can be used, and this is placed into a silicone sleeve with sheds designed for outdoor application.

The new development can utilize a standard voltage sensor and parts that can be produced in high volumes, with certain fixation parts that can be common for all uses and with other fixation parts that can be designed for a variety of different situation. Thus, in effect a modular construction that can be used in outdoor situations, with different fixation requirements is enables, achieving lower costs for an overall solution as well as standardization in production.

The following specific embodiments focusses on a voltage sensor that has the silicone sleeve for outdoor use. Thus, the new development uses an indoor-graded voltage sensor 2 designed for indoor voltage measurements in a cable termination. Such a standardized voltage sensor, or at least part of its design, is inserted into a standard silicone rubber sleeve 1, which will ensure protection and performance under outdoor conditions. Additional base part or parts 3 and 4 can be used to within—by part 3—and cover—by part 4—the remaining part of the sleeve, in order to accommodate fixation means to be used to mount the sensor on external structures.

Figure 2:
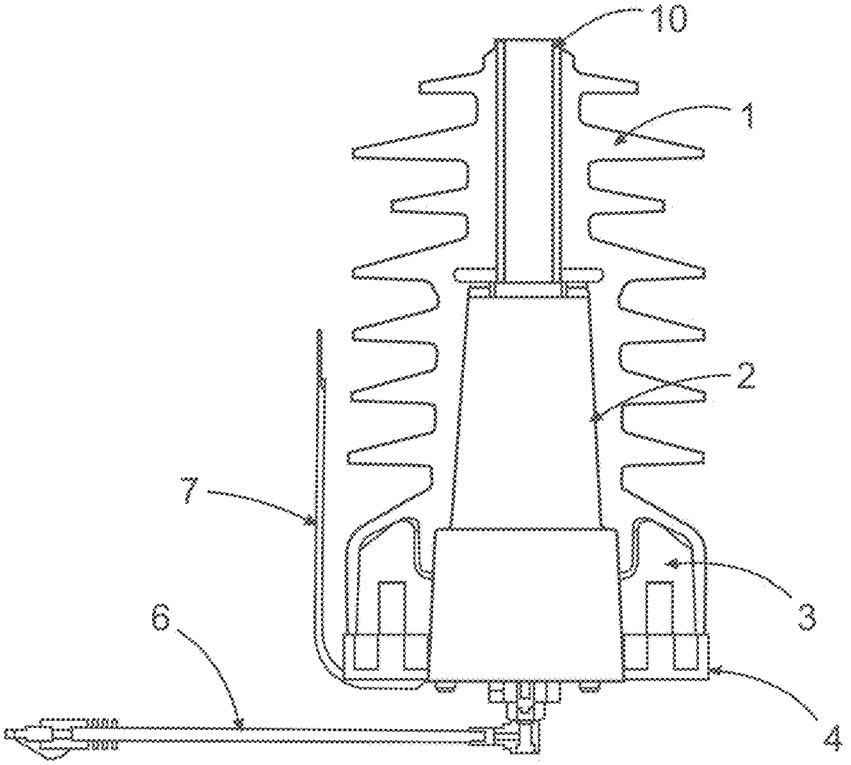
FIG. 2 shows a schematic representation of an example of a medium or high voltage sensor in accordance with the disclosure.

FIG. 1 shows schematics of the light outdoor medium- or high-voltage voltage sensor 5 construction. The different parts can be considered to be a kit of parts that be used to form a voltage sensor 5. FIG. 2 shows a cross-section of the light medium- or high-voltage voltage sensor.

Figure 3:
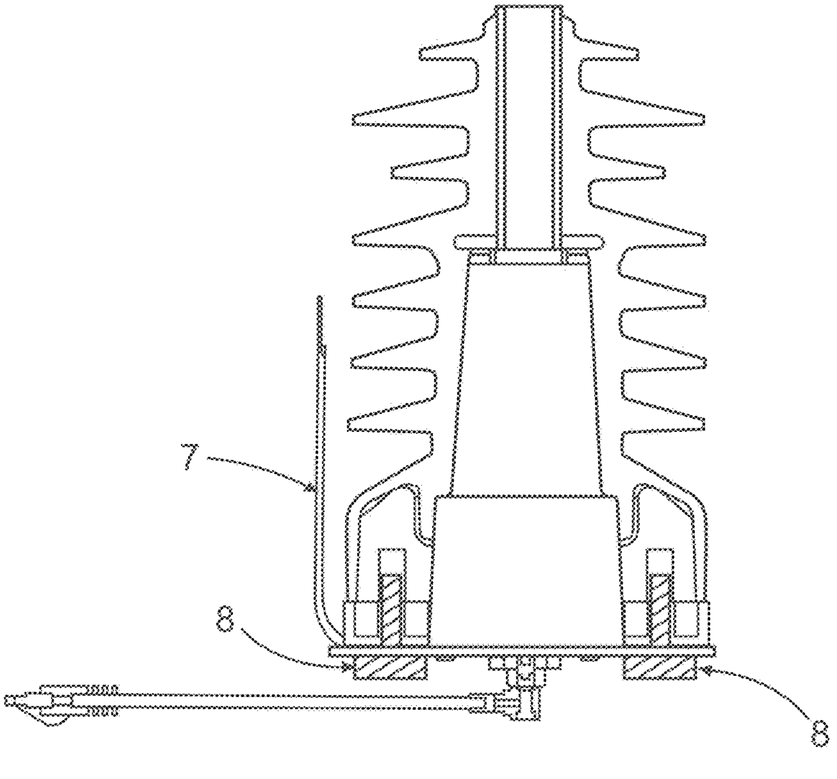
FIG. 3 shows a schematic representation of an example of a medium or high voltage sensor in accordance with the disclosure.

FIG. 2 shows a cross-section of the assembled voltage sensor. Apart from standard parts described above, the voltage sensor is equipped with outdoor-grade output cable 6. The outdoor cable 6 can be a standard outdoor coaxial cable terminated by a connector or just by wires. Furthermore, the voltage sensor 5 is shown equipped with earthing wire 7. However alternatively or additionally earthing can also be provided through the fixation means 8 of an external structure that can be at ground or earth potential. Example of both options are shown in FIG. 3.

In the situation when the voltage sensor 5 is standing on a support structure (not shown), which is typically metallic construction that is connected to earth, it is preferable to use the mechanical fixations means 8 for grounding connection as well. Mechanical fixations means are used primarily for mechanical positioning of the voltage sensor, in order to ensure proper placement of such a voltage sensor.

In the situation when the voltage sensor 5 is not standing on or fixed to any kind of metallic and grounded support structure, but rather hanging on a wire whose voltage is to be measured or standing on an insulated support structure, a ground connection can be provided through the outdoor-graded or outdoor protected earthing wire 7 or alternatively through shielding of the output cable 6.

Figure 4:
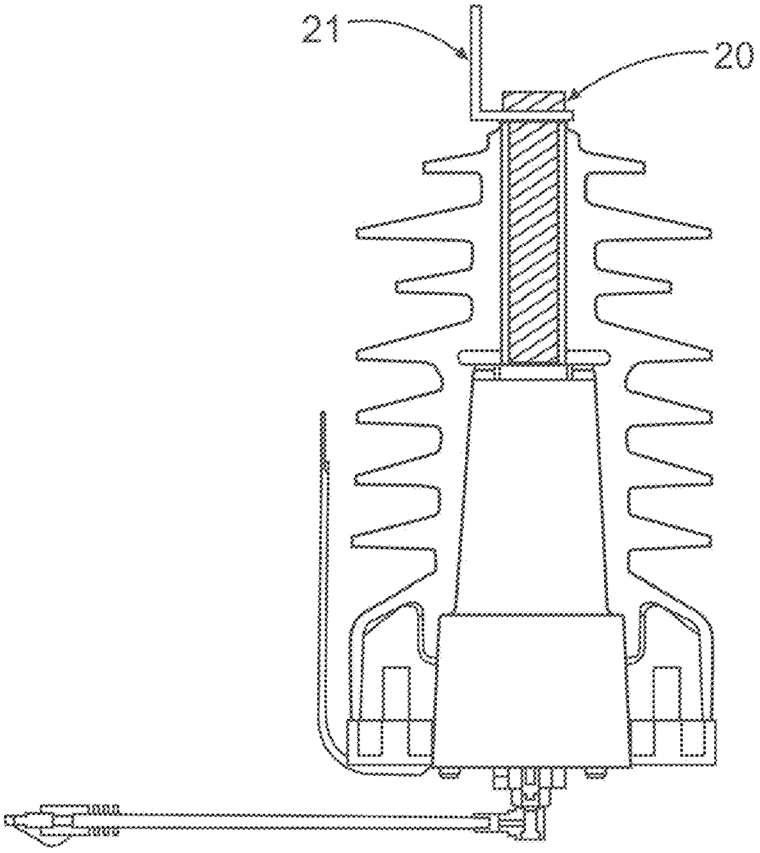
FIG. 4 shows a schematic representation of an example of a medium or high voltage sensor in accordance with the disclosure.
Figure 5:
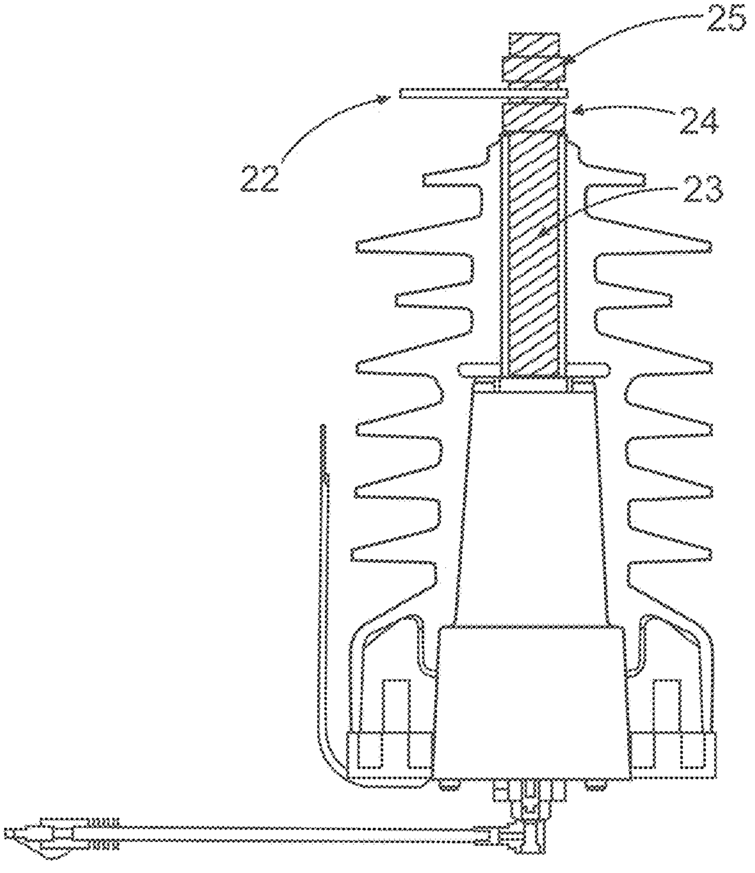
FIG. 5 shows a schematic representation of an example of a medium or high voltage sensor in accordance with the disclosure.

Examples of termination for the primary terminal 10 to be connected to the wire whose voltage is to be measured is shown in FIGS. 4-5. FIG. 4 shows a connection screw 20 that is fixing the additional bar 21, to which the connection to medium- or high-voltage is to be made, to the voltage sensor 5. FIG. 5 shows a threaded rod 23 screwed to the voltage sensor 5 and fixed by a fixation nut 24. Voltage connection can be realized by a cable eyelet 22 which is then fixed to the threaded rod 23 by additional nut 25.

The Light outdoor medium- or high-voltage voltage sensor 5 thus consists of at least a part of indoor graded voltage sensor 2 covered by outdoor-graded shell 1, fixation means and output cable. Mechanical fixation means 8 can be at voltage sensor base (standing) with medium/high voltage connection 21 at the top of the outdoor housing. Mechanical fixation means 20 or 23 can be at the top of the outdoor housing, together with medium/high voltage connection 22. An output cable can be an outdoor-graded output cable. An output cable can be an indoor-graded output cable, which goes through other surrounding structures or parts that provide outdoor protection. An outdoor-graded shell can be made of a silicone-based material.

An outdoor-graded shell can be made from outdoor thermoplast or thermoset material. An outdoor shell can be tightly slipped/pulled over the indoor voltage sensor (to provide a mechanical connection). An outdoor shell can be cast over at least part of the indoor voltage sensor.

In an example, the at least one fixation part comprises a first fixation part and a second fixation part. An inner surface of the first fixation part is located adjacent to an outer surface of the medium or high voltage sensor unit. The outer surface of the medium or high voltage sensor unit is cylindrically shaped or conically shaped. The second fixation part is connected to the first fixation part.

In an example, an inner surface of the first fixation part is cylindrically shaped or conically shaped. In an example, the second fixation part is connected to an end portion of the first fixation part. In an example, the end portion of the first fixation part is annular shaped. In an example, the medium or high voltage sensor unit comprises an impedance voltage divider. In an example, the medium or high voltage sensor unit comprises an instrument voltage transformer or low-power instrument voltage transformer designed for indoor use. In an example, the first terminal of the medium or high voltage sensor unit is a terminal at an end position of a plurality of capacitive and/or resistive elements of the impedance voltage divider. In an example, the second terminal of the medium or high voltage sensor unit is a terminal at a position between capacitive and/or resistive elements of the impedance voltage divider.

In an example, the at least one fixation part is connected to a third terminal of the medium or high voltage sensor unit. In an example, the third terminal is a terminal at an end position of a plurality of capacitive and/or resistive elements of the impedance voltage divider.

In an example, sensor comprises an earthing wire or at least an earthing terminal. The earthing wire or the at least an earthing terminal is connected to the at least one fixation part to provide an earth connection for the medium or high voltage sensor unit. In an example, the sensor comprises an earthing wire. The earthing wire is connected to the earth terminal located within one fixation part to provide an earth connection for the medium or high voltage sensor unit.

In an example, the sensor comprises a silicone rubber sleeve. The silicone rubber sleeve is located around an outer surface of the medium or high voltage sensor unit. In an example, the silicone rubber sleeve is located around an outer surface of the primary connection.

In an aspect, there is provided a kit of parts to form a medium or high voltage sensor, comprising: a medium or high voltage sensing unit; a primary connection; a cable connection; and at least one fixation part.

The primary connection is configured to connect to a first terminal of the medium or high voltage sensor unit. The cable connection is configured to connect to a second terminal of the medium or high voltage sensor unit. The at least one fixation part is configured to be located at a base end of the medium or high voltage sensor unit. The at least one fixation part is configured to connect to an external structure.

In an aspect, there is provided a method of manufacturing a medium or high voltage sensor, comprising: connecting a primary connection to a first terminal of a medium or high voltage sensing unit; connecting a cable connection to a second terminal of the medium or high voltage sensor unit; locating at least one fixation part at a base end of the medium or high voltage sensing unit; and wherein the at least one fixation part is configured to connect to an external structure.

In an aspect, there is provided a method of manufacturing a medium or high voltage sensor, comprising: connecting a primary connection to a first terminal of a medium or high voltage sensor unit; connecting a cable connection to a second terminal of the medium or high voltage sensor unit; filling the remaining bottom part of silicone rubber sleeve with thermoplastic or thermoset material, thus forming at least portion of one fixation part at a base end of the medium or high voltage sensor unit; and wherein the at least one fixation part is configured to connect to an external structure.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A medium or high voltage sensor, comprising:
- a medium or high voltage sensing unit;
- a primary connection;
- a cable connection; and
- at least one fixation part;
- wherein the primary connection is connected to a first terminal of the medium or high voltage sensor unit;
- wherein the cable connection is connected to a second terminal of the medium or high voltage sensor unit;
- wherein the at least one fixation part is located at a base end of the medium or high voltage sensor unit; and
- wherein the at least one fixation part is configured to connect to an external structure,
- wherein the at least one fixation part comprises a first fixation part and a second fixation part, wherein an inner surface of the first fixation part is in contact with an outer surface of the medium or high voltage sensor unit, wherein the outer surface of the medium or high voltage sensor unit is cylindrically shaped or conically shaped; and wherein the second fixation part is connected to the first fixation part.

2. The sensor according to claim 1, wherein the inner surface of the first fixation part is cylindrically shaped or conically shaped.

3. The sensor according to claim 1, wherein the second fixation part is connected to an end portion of the first fixation part.

4. The sensor according to claim 3, wherein the end portion of the first fixation part is annular shaped.

5. The sensor according to claim 1, wherein the medium or high voltage sensor unit comprises a capacitive and/or resistive voltage divider.

6. The sensor according to claim 5, wherein the first terminal of the medium or high voltage sensor unit is a terminal at an end position of a plurality of capacitive and/or resistive elements of an impedance voltage divider.

7. The sensor according to claim 5, wherein the second terminal of the medium or high voltage sensor unit is a terminal at a position between capacitive and/or resistive elements of an impedance voltage divider.

8. The sensor according to claim 1, wherein the at least a portion of one fixation part is connected to a third terminal of the medium or high voltage sensor unit.

9. The sensor according to claim 8, wherein the third terminal is a terminal at an end position of a plurality of capacitive and/or resistive elements of an impedance voltage divider.

10. The sensor according to claim 1, wherein the sensor comprises an earthing wire, and wherein the earthing wire is connected to the at least a portion of one fixation part to provide an earth connection for the medium or high voltage sensor unit.

11. The sensor according to claim 1, wherein the sensor comprises an earthing wire, and wherein the earthing wire is connected to an earth terminal located within one fixation part to provide an earth connection for the medium or high voltage sensor unit.

12. The sensor according to claim 1, wherein the sensor comprises a silicone rubber sleeve, and wherein the silicone rubber sleeve is located around an outer surface of the medium or high voltage sensing unit.

13. The sensor according to claim 12, wherein the silicone rubber sleeve is located at least partly around an outer surface of the primary connection.

14. A kit of parts to form a medium or high voltage sensor, comprising:
- a medium or high voltage sensing unit;
- a primary connection;
- a cable connection; and
- at least one fixation part;
- wherein the primary connection is configured to connect to a first terminal of the medium or high voltage sensor unit;
- wherein the cable connection is configured to connect to a second terminal of the medium or high voltage sensor unit;
- wherein the at least one fixation part is configured to be located at a base end of the medium or high voltage sensor unit; and
- wherein the at least one fixation part is configured to connect to an external structure,
- wherein the at least one fixation part comprises a first fixation part and a second fixation part, wherein an inner surface of the first fixation part is in contact with an outer surface of the medium or high voltage sensor unit, wherein the outer surface of the medium or high voltage sensor unit is cylindrically shaped or conically shaped; and wherein the second fixation part is connected to the first fixation part.

15. A method of manufacturing a medium or high voltage sensor, comprising:

connecting a primary connection to a first terminal of a medium or high voltage sensor unit;

connecting a cable connection to a second terminal of the medium or high voltage sensor unit;

locating at least one fixation part at a base end of the medium or high voltage sensor unit; and wherein the at least one fixation part is configured to connect to an external structure;

wherein the at least one fixation part comprises a first fixation part and a second fixation part, and the method further comprises:

locating an inner surface of the first fixation part adjacent to an outer surface of the medium or high voltage sensor unit, wherein the outer surface of the medium or high voltage sensor unit is cylindrically shaped or conically shaped connecting the second fixation part to the first fixation part; and contacting the inner surface of the first fixation part with the outer surface of the medium or high voltage sensor unit.

16. A method of manufacturing a medium or high voltage sensor, comprising:

connecting a primary connection to a first terminal of a medium or high voltage sensor unit;

connecting a cable connection to a second terminal of the medium or high voltage sensor unit;

filling the remaining bottom part of silicone rubber sleeve with thermoplastic or thermoset material, thus forming at least portion of one fixation part at a base end of the medium or high voltage sensor unit; and wherein the at least one fixation part is configured to connect to an external structure;

wherein the at least one fixation part comprises a first fixation part and a second fixation part, and the method further comprises:

locating an inner surface of the first fixation part adjacent to an outer surface of the medium or high voltage sensor unit, wherein the outer surface of the medium or high voltage sensor unit is cylindrically shaped or conically shaped connecting the second fixation part to the first fixation part; and contacting the inner surface of the first fixation part with the outer surface of the medium or high voltage sensor unit.

* * * * *